US009761996B2

(12) United States Patent
Lin et al.

(10) Patent No.: US 9,761,996 B2
(45) Date of Patent: Sep. 12, 2017

(54) M.2 INTERFACE MEMORY DEVICE AND M.2 INTERFACE CONNECTION SEAT INSERTEDLY PROVIDED THEREOF

(71) Applicant: Innodisk Corporation, New Taipei (TW)

(72) Inventors: Chen-Huan Lin, New Taipei (TW); Hsiao-Yu Wang, New Taipei (TW)

(73) Assignee: INNODISK CORPORATION, New Taipei (TW)

( * ) Notice: Subject to any disclaimer, the term of this patent is extended or adjusted under 35 U.S.C. 154(b) by 0 days.

(21) Appl. No.: 15/222,859

(22) Filed: Jul. 28, 2016

(65) Prior Publication Data

US 2017/0179642 A1   Jun. 22, 2017

(30) Foreign Application Priority Data

Dec. 17, 2015   (TW) .............................. 104142548 A

(51) Int. Cl.
| | |
|---|---|
| H01R 13/631 | (2006.01) |
| H01R 13/627 | (2006.01) |
| H01R 27/00 | (2006.01) |
| H01R 12/73 | (2011.01) |
| H01R 13/633 | (2006.01) |
| H05K 5/02 | (2006.01) |

(52) U.S. Cl.
CPC ........... *H01R 13/631* (2013.01); *H01R 12/73* (2013.01); *H01R 13/627* (2013.01); *H01R 13/633* (2013.01); *H01R 27/00* (2013.01); *H05K 5/0269* (2013.01)

(58) Field of Classification Search
CPC .................................................... H01R 13/631
See application file for complete search history.

(56) References Cited

U.S. PATENT DOCUMENTS

| | | | | |
|---|---|---|---|---|
| 5,286,214 A | * | 2/1994 | Takahashi | ............ G06K 7/0047 |
| | | | | 439/159 |
| 5,318,452 A | * | 6/1994 | Brennian, Jr. | ....... G06K 7/0047 |
| | | | | 439/541.5 |
| 6,186,801 B1 | * | 2/2001 | Kakinoki | ......... H01R 13/65802 |
| | | | | 361/737 |

(Continued)

FOREIGN PATENT DOCUMENTS

| | | |
|---|---|---|
| CN | 1411111 A | 4/2003 |
| TW | M452519 U1 | 5/2013 |

*Primary Examiner* — James Harvey
(74) *Attorney, Agent, or Firm* — Chun-Ming Shih

(57) ABSTRACT

The invention provides a M.2 interface memory device and a M.2 interface connection seat insertedly provided thereof. The M.2 interface memory device comprises a M.2 interface card and a housing provided with at least one guide groove. The M.2 interface connection seat is disposed on a circuit board, and comprises two arms and a base comprising a M.2 interface slot. At least one arm is provided with a guide rail. An opening direction of the M.2 interface slot is horizontal to a surface of the circuit board. When the M.2 interface card is inserted into the M.2 interface slot in a horizontal direction, the M.2 interface memory device will be fixed within the M.2 interface connection seat by embedding between the guide groove and the guide rail. Thus, M.2 interface memory devices of a variety of specification lengths are able to be inserted into the M.2 interface connection seat.

7 Claims, 7 Drawing Sheets

(56) References Cited

U.S. PATENT DOCUMENTS

| | | | | |
|---|---|---|---|---|
| 7,025,637 B1* | 4/2006 | Lee | ........................ | H01R 27/00 |
| | | | | 439/638 |
| 2003/0040222 A1* | 2/2003 | Price | ....................... | H01R 27/02 |
| | | | | 439/638 |
| 2006/0223343 A1* | 10/2006 | Campini | ................ | H05K 1/144 |
| | | | | 439/64 |
| 2007/0037417 A1* | 2/2007 | Katayanagi | ...... | H01R 13/65802 |
| | | | | 439/76.1 |
| 2007/0134987 A1* | 6/2007 | Yen | .................... | H01R 13/7032 |
| | | | | 439/630 |
| 2011/0058329 A1* | 3/2011 | Lin | ...................... | H05K 5/0282 |
| | | | | 361/679.45 |
| 2013/0045621 A1* | 2/2013 | George | ................ | H01R 13/631 |
| | | | | 439/374 |
| 2015/0222761 A1* | 8/2015 | Zhao | ........................ | H01H 7/00 |
| | | | | 455/572 |
| 2016/0154762 A1* | 6/2016 | He | ..................... | G06F 13/4282 |
| | | | | 710/301 |
| 2016/0268713 A1* | 9/2016 | Norton | .................... | G06F 13/00 |
| 2017/0179642 A1* | 6/2017 | Lin | ...................... | H05K 5/0269 |

\* cited by examiner

M.2 INTERFACE MEMORY DEVICE AND M.2 INTERFACE CONNECTION SEAT INSERTEDLY PROVIDED THEREOF

This non-provisional application claims priority claim under 35 U.S.C. §119(a) on Taiwan Patent Application No. 104142548 filed Dec. 17, 2015, the entire contents of which are incorporated herein by reference.

FIELD OF THE INVENTION

The present invention relates to a connector and a connection seat insertedly provided thereof, more particularly, to a connector and a connection seat conforming to M.2 interface standard specification.

BACKGROUND

M.2 is a transmission interface of new standard specification established by PCI-SIG and SATA-IO associations. M.2, originally known as the NGFF (Next Generation Form Factor), is now called M.2. M.2 interface can support the standard specifications of SATA, USB and PCIe, has a variety of dimensions and the advantage of fast transmission speed, and can be applied to various kinds of expansion cards like the solid state disk (SSD), WIFI, Bluetooth and near field communication (NFC), etc.

Referring to FIG. 1(A) and FIG. 1(B), there are shown the three-dimensional views of the M.2 interface card inserted into the M.2 interface connection seat in prior arts. As shown in the figures, the M.2 interface connection seat 15 is disposed on a circuit board 10. The M.2 interface connection seat 15 is provided with a slot for inserting the M.2 interface card 11, and an opening direction of the slot is parallel to the surface of the circuit board 10. So the M.2 interface card 11 is inserted into the slot of the M.2 interface connection seat 15 in a horizontal direction.

The slot of the M.2 interface connection seat 15 is provided on at least one inner edge thereof with at least one metal spring. When the M.2 interface card 11 is inserted into the slot of the M.2 interface connection seat 15, the rear end of the M.2 interface card 11 may be upturned because the elasticity force of the metal spring, as shown in FIG. 1(A).

The rear end of the M.2 interface card 11 is provided with a notch 111, and the circuit board 10 is provided with a hole 101. When the M.2 interface card 11 is inserted into the M.2 interface connection seat 15, the notch 111 will be aligned with the hole 101 of the circuit board 10. A screw fixed member 17 can be used for fixing the M.2 interface card 11 on the circuit board 10 through the notch 111 and the hole 101 so as to avoid the upturned situation occurred on the rear end of the M.2 interface card 11, as shown in FIG. 1(B).

Currently, the M.2 interface card 11 is developed with various specifications like 22 mm (width)×30 mm (length), 22 mm×42 mm, 22 mm×60 mm, 22 mm×80 mm and 22 mm×110 mm. Besides, the hole 101 of the circuit board 10 is disposed on a fixed position, and therefore a fixed distance is exist between the M.2 interface connection seat 15 and the hole 101 of the circuit board 10. Accordingly, the length of the M.2 interface card must match with this fixed distance, or else the M.2 interface card 11 can not be fixed on the circuit board 10. Therefore, the selectivity of the specification of the M.2 interface card 11 will be limited when the M.2 interface card 11 is fixed by the way of locking.

Furthermore, the M.2 interface card 11 is fixed by adopting the way of locking, in which it requires a screwdriver to install the M.2 interface card 11 on the circuit board 10 or disassemble the M.2 interface card 11 from the circuit board 10, in such the way that there is a certain inconvenience in the operation.

SUMMARY

It is one object of the present invention to provide a M.2 interface memory device and a M.2 interface connection seat insertedly provided thereof, in which the M.2 interface connection seat comprises a M.2 interface slot and a card accommodating area, and the M.2 interface memory device comprises a M.2 interface card. When the M.2 interface card of the M.2 interface memory device is inserted into the M.2 interface slot of the M.2 interface connection seat, the M.2 interface memory device will be fixed within the card accommodating area of the M.2 interface connection seat by a embedded structure consisted of a guide groove and a guide rail. Accordingly, by the embedded structure disposed between the M.2 interface memory device and the M.2 interface connection seat, the upturned situation occurred on the rear end of the M.2 interface memory device can be avoid when the M.2 interface memory device is inserted into the M.2 interface connection seat, and M.2 interface memory devices of a variety of specification lengths are able to be inserted into the M.2 interface connection seat so as to increase the convenience on the selection of the specification of the M.2 interface memory device.

To achieve the above object, the present invention provides a M.2 interface connection seat, disposed on a circuit board, comprising: a base comprising an interface slot conforming to M.2 interface standard specification, wherein the interface slot comprises an opening, a direction of the opening of the interface slot is horizontal to a surface of the circuit board; and two arms provided on two sides of the base, respectively, a card accommodating area formed between the two arms and the base, wherein a M.2 interface memory device enters the M.2 interface connection seat via the card accommodating area, and the M.2 interface memory device is inserted into the interface slot of the M.2 interface connection seat by an interface card conforming to M.2 interface standard specification.

In one embodiment of the present invention, at least one of the arms is provided with a guide groove for guiding the M.2 interface memory device into the card accommodating area of the M.2 interface connection seat.

In one embodiment of the present invention, the M.2 interface memory device is covered with a housing, the housing comprises a guide rail; when the M.2 interface memory device enters the card accommodating area of the M.2 interface connection seat, the guide rail will be embedded with the guide groove, so that the M.2 interface memory device is able to enter or exit the card accommodating area of the M.2 interface connection seat by the guide rail moving on the guide groove of the M.2 interface connection seat.

In one embodiment of the present invention, at least one of the arms is provided with a guide rail for guiding the M.2 interface memory device into the card accommodating area of the M.2 interface connection seat.

In one embodiment of the present invention, the M.2 interface memory device is covered with a housing, the housing comprises a guide groove; when the M.2 interface memory device enters the card accommodating area of the M.2 interface connection seat, the guide groove will be embedded with the guide rail, so that the M.2 interface memory device is able to enter or exit the card accommodating area of the M.2 interface connection seat by the guide groove moving on the guide rail of the M.2 interface connection seat.

In one embodiment of the present invention, at least one of the arms is provided with a card ejecting mechanism, the interface card of the M.2 interface memory device is able to be fixed within the card accommodating area of the M.2 interface connection seat through the card ejecting mechanism, or the interface card of the M.2 interface memory device is able to be ejected and withdrawn from the card accommodating area of the M.2 interface connection seat through the card ejecting mechanism.

In one embodiment of the present invention, the M.2 interface connection seat is located at an edge position of board body of the circuit board, the opening of the interface slot of the M.2 interface connection seat is placed outwardly, and thus the M.2 interface memory device is able to enter or exit the card accommodating area of the M.2 interface connection seat from the edge position of board body of the circuit board.

The present invention further provides a M.2 interface memory device, comprising: an interface card, conforming to M.2 interface standard specification, provided with at least one memory element, wherein the interface card of the M.2 interface memory device can be inserted into an interface slot of a M.2 interface connection seat disposed on a circuit board; and a housing disposed on the outside of the interface card to cover a body of the interface card, wherein the interface card comprises a plurality of interface terminals protruding from the housing, and the housing is provided on at least one side surface thereof with a guide rail; wherein the M.2 interface connection seat comprises two arms and a base, the two arms are provided on two sides of the base, respectively, a card accommodating area is formed between the two arms and the base, the base comprises a interface slot conforming to M.2 interface standard specification, and at least one of the arms is provided with a guide groove; when the M.2 interface memory device enters the card accommodating area of the M.2 interface connection seat, the guide rail will be embedded in the guide groove, so that the M.2 interface memory device is able to enter or exit the card accommodating area of the M.2 interface connection seat by the guide rail moving on the guide groove of the M.2 interface connection seat.

The present invention further provides a M.2 interface memory device, comprising: an interface card, conforming to M.2 interface standard specification, provided with at least one memory element, wherein the interface card of the M.2 interface memory device can be inserted into an interface slot of a M.2 interface connection seat disposed on a circuit board; and a housing disposed on the outside of the interface card to cover a body of the interface card, wherein the interface card comprises a plurality of interface terminals protruding from the housing, and the housing is provided on at least one side surface thereof with a guide groove; wherein the M.2 interface connection seat comprises two arms and a base, the two arms are provided on two sides of the base, respectively, a card accommodating area is formed between the two arms and the base, the base comprises a interface slot conforming to M.2 interface standard specification, and at least one of the arms is provided with a guide rail; when the M.2 interface memory device enters the card accommodating area of the M.2 interface connection seat, the guide groove will be embedded with the guide rail, so that the M.2 interface memory device is able to enter or exit the card accommodating area of the M.2 interface connection seat by the guide groove moving on the guide rail of the M.2 interface connection seat.

In one embodiment of the present invention, the interface card of the M.2 interface memory device is inserted into the interface slot of the M.2 interface connection seat in a direction that is horizontal to a surface of the circuit board.

DETAILED DESCRIPTION OF THE PREFERRED EMBODIMENTS

Figure 1:
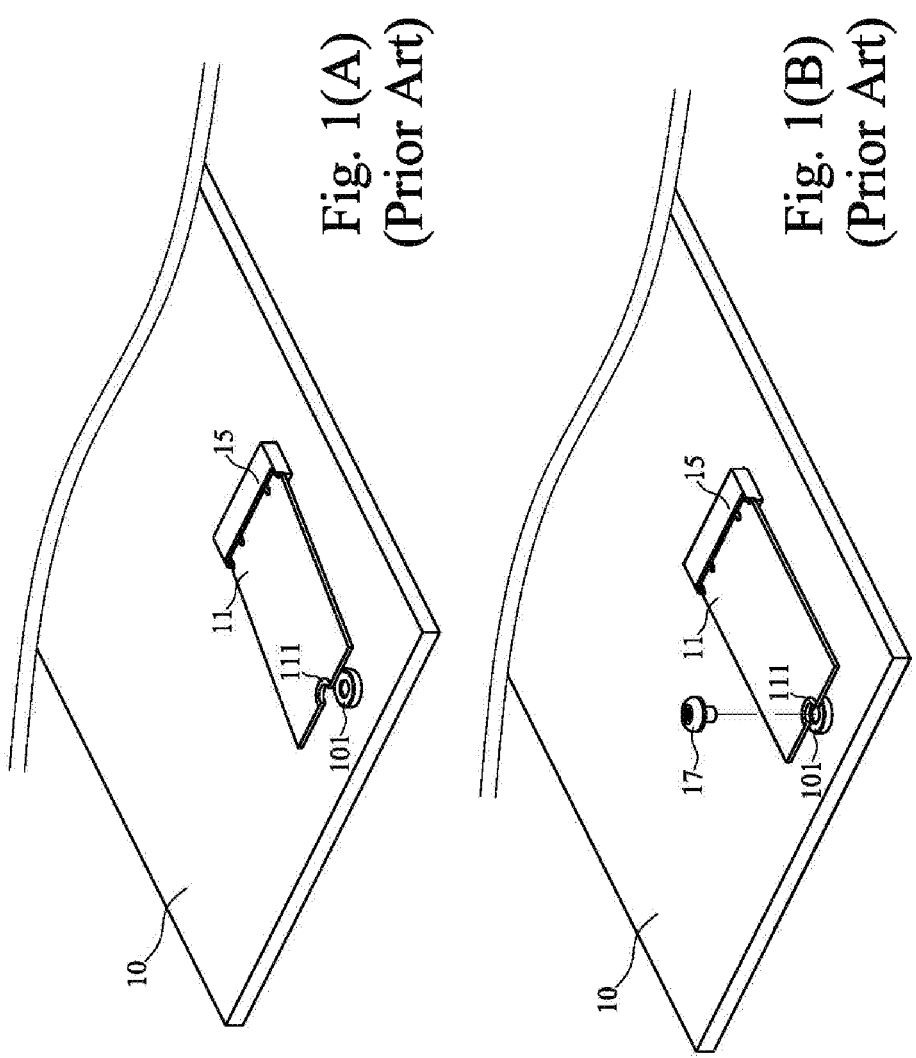
FIG. 1(A) and FIG. (B) are three-dimensional views of the M.2 interface card inserted into the M.2 interface connection seat in prior arts.
Figure 2:
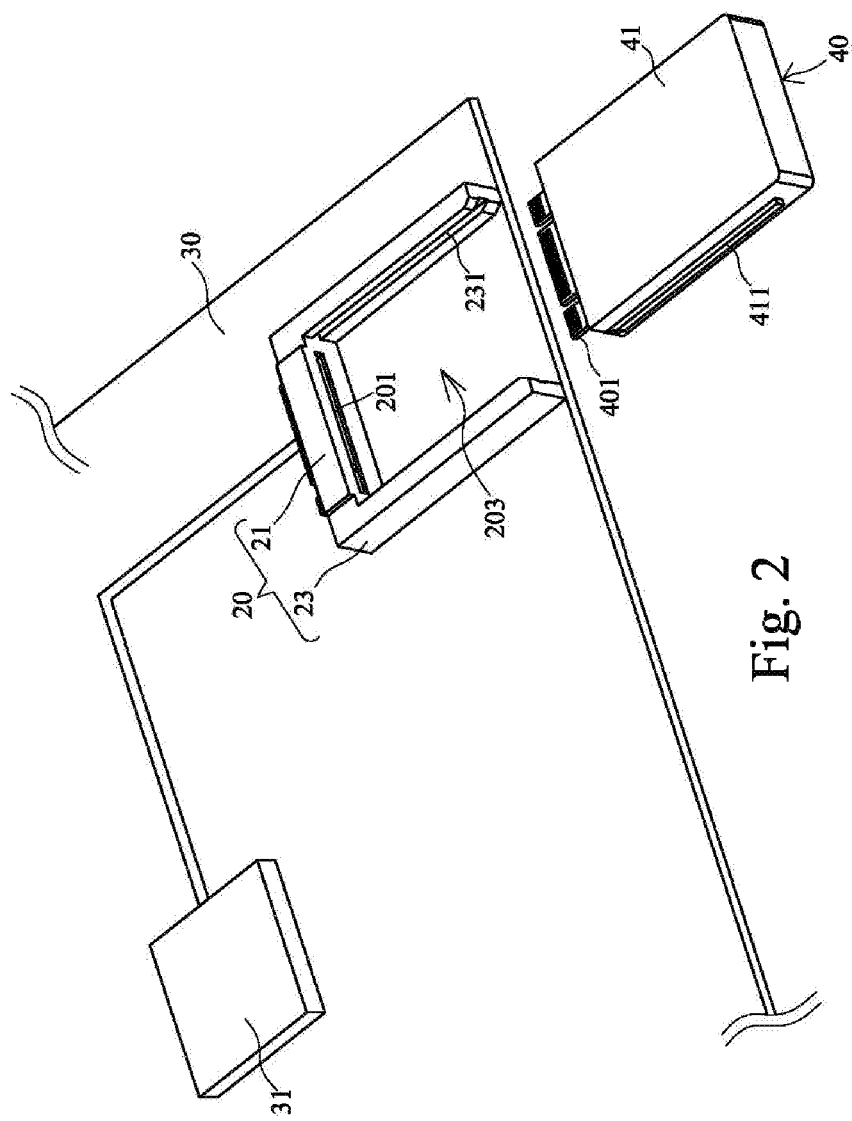
FIG. 2 is a three-dimensional view of the M.2 interface memory device separated from the M.2 interface connection seat according to an embodiment of the present invention.
Figure 3:
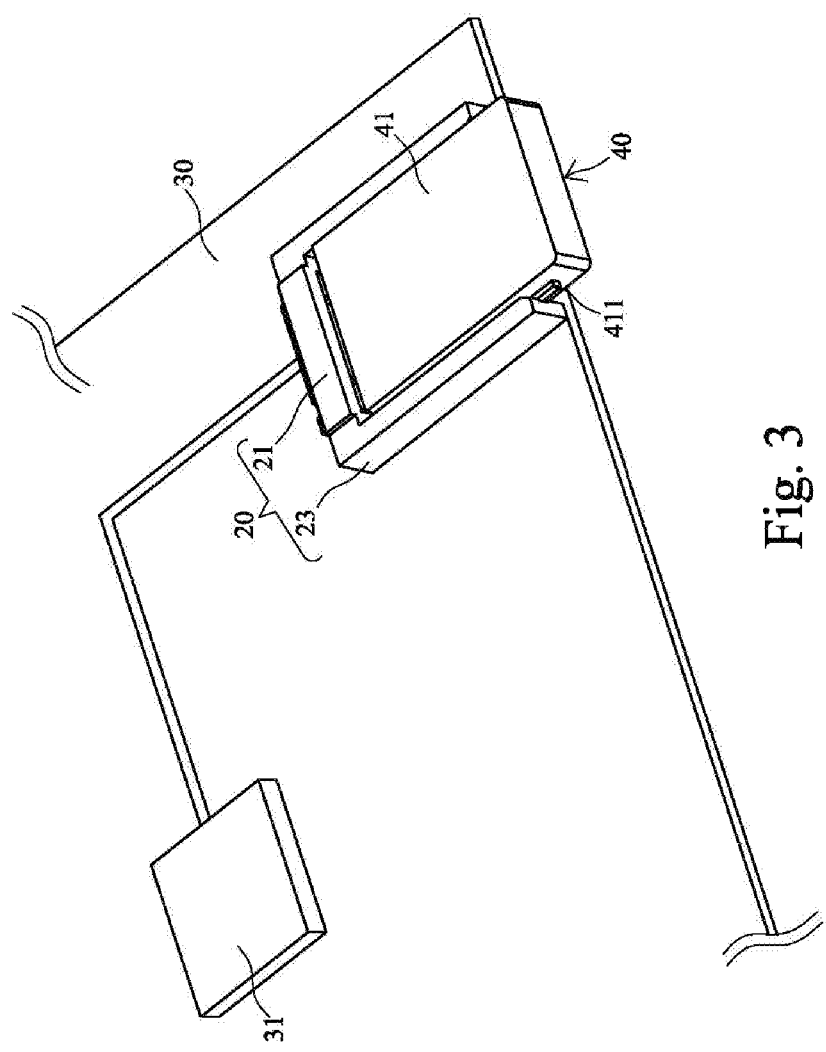
FIG. 3 is a three-dimensional view of the M.2 interface memory device inserted into the M.2 interface connection seat according to an embodiment of the present invention.

Referring to FIG. 2, there is shown a three-dimensional view of the M.2 interface memory device separated from the M.2 interface connection seat according to an embodiment of the present invention, and referring to FIG. 3, there is shown a three-dimensional view of the M.2 interface connector inserted into the M.2 interface connection seat according to an embodiment of the present invention. As shown in FIG. 2 and FIG. 3, the present invention comprises a M.2 interface connection seat 20 and a M.2 interface memory device 40. The M.2 interface connection seat 20 is disposed on a circuit board 30, and comprising a base 21 and two arms 23. The two arms 23 are provided on two sides of the base 21, respectively. A card accommodating area 203 is formed between the base 21 and the two arms 23. The M.2 interface memory device 40 may enter to or exit from the M.2 interface connection seat 20 via the card accommodating area 203. The base 21 comprises a interface slot 201 conforming to M.2 interface standard specification. The interface slot 201 comprises an opening, a direction of the opening of the interface slot 201 is horizontal to the surface of the circuit board 30.

The M.2 interface memory device 40 comprises an interface card 401 and a housing 41. The interface card 401 is conforming to M.2 interface standard specification, and provided with at least one memory element. The housing 41 is disposed on the outside of the interface card 401 to cover a body of the interface card 401. The interface card 401 comprises a plurality of interface terminals protruding from the housing 41. In the present invention, the interface card

401 may be an interface card of 2230 (22 mm×30 mm), 2242 (22 mm×42 mm), 2260 (22 mm×60 mm), 2280 (22 mm×80 mm) or 22110 (22 mm×110 mm) specification.

In one embodiment of the present invention, at least one arm 23 of the M.2 interface connection seat 20 is provided with a guide groove 231, and the housing 41 of the M.2 interface memory device 40 is provided on at least one side surface thereof with a guide rail 411. When the M.2 interface memory device 40 enters the card accommodating area 203 of the M.2 interface connection seat 20, the guide rail 411 will be embedded within the guide groove 231. and the M.2 interface memory device 40 can move on the guide groove 231 by the guide rail 411 so as to make the interface card 401 capable of being inserted into the interface slot 201 of the M.2 interface connection seat 20. Afterward, the processor 31 of the circuit board 30 can access the data for the M.2 interface memory device 40 by the electrically connection between the interface card 401 and the interface slot 201. In the present invention, the interface card 401 of the M.2 interface memory device 40 is inserted into the interface slot 201 of the M.2 interface connection seat 20 in a direction that is horizontal to the surface of the circuit board 30.

In another embodiment of the present invention, the M.2 interface connection seat 20 is located at an edge position of board body of the circuit board 30, and the opening of the interface slot 201 of the M.2 interface connection seat 20 is placed outwardly, so that the M.2 interface memory device 40 can enter or exit the card accommodating area 203 of the M.2 interface connection seat 20 from the edge position of board body of the circuit board 30, in such the way that the implementation of a hot swapping of the M.2 interface memory device 40 is convenience.

As the above described, when the M.2 interface card 401 of the M.2 interface memory device 40 is inserted into the interface slot 201 of the M.2 interface connection seat 20 in a horizontal direction, the M.2 interface memory device 40 will be fixed within the card accommodating area 203 of the M.2 interface connection seat 20 by embedding between the guide groove 231 and the guide rail 411. Accordingly, the upturned situation occurred on the rear end of the M.2 interface memory device 40 will be avoid, and M.2 interface memory devices 40 of a variety of specification lengths are able to be inserted into the M.2 interface connection seat 20 so as to increase the convenience on the selection of the specification of the M.2 interface memory device 40.

Figure 4:
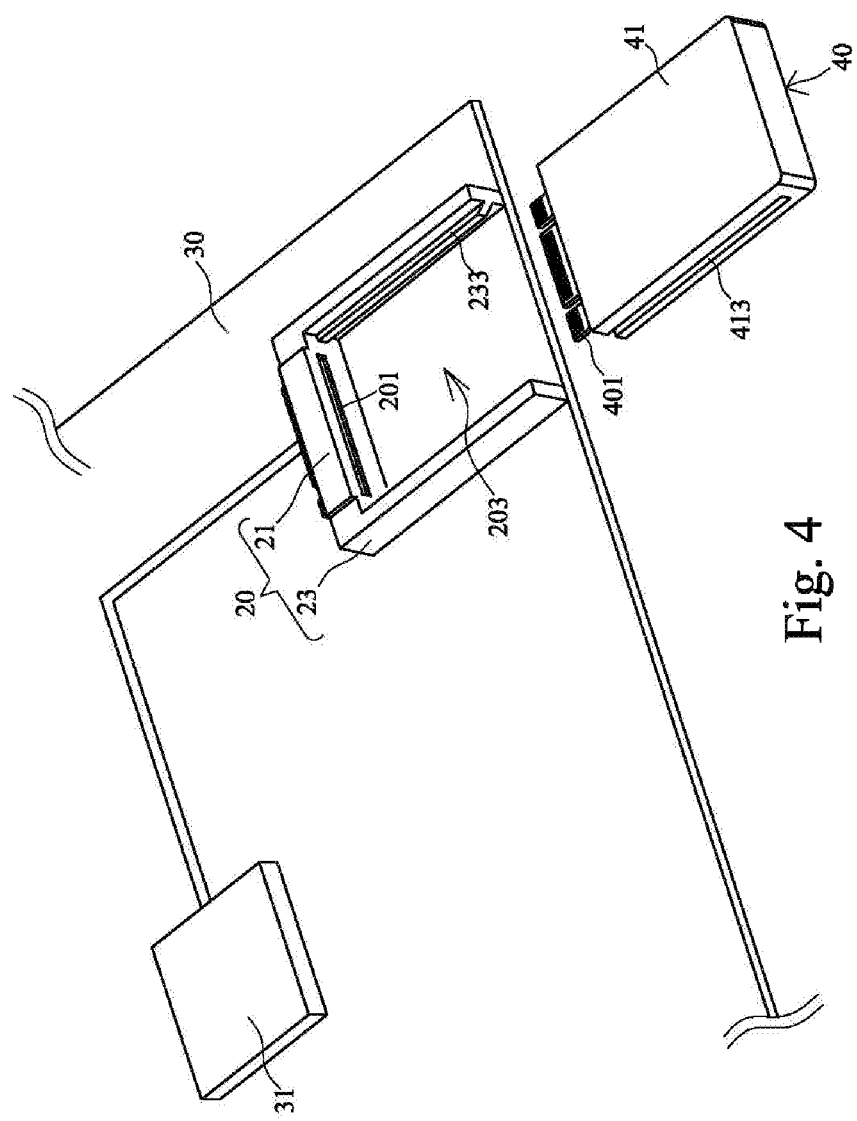
FIG. 4 is a three-dimensional view of the M.2 interface memory device separated from the M.2 interface connection seat according to another embodiment of the present invention.
Figure 5:
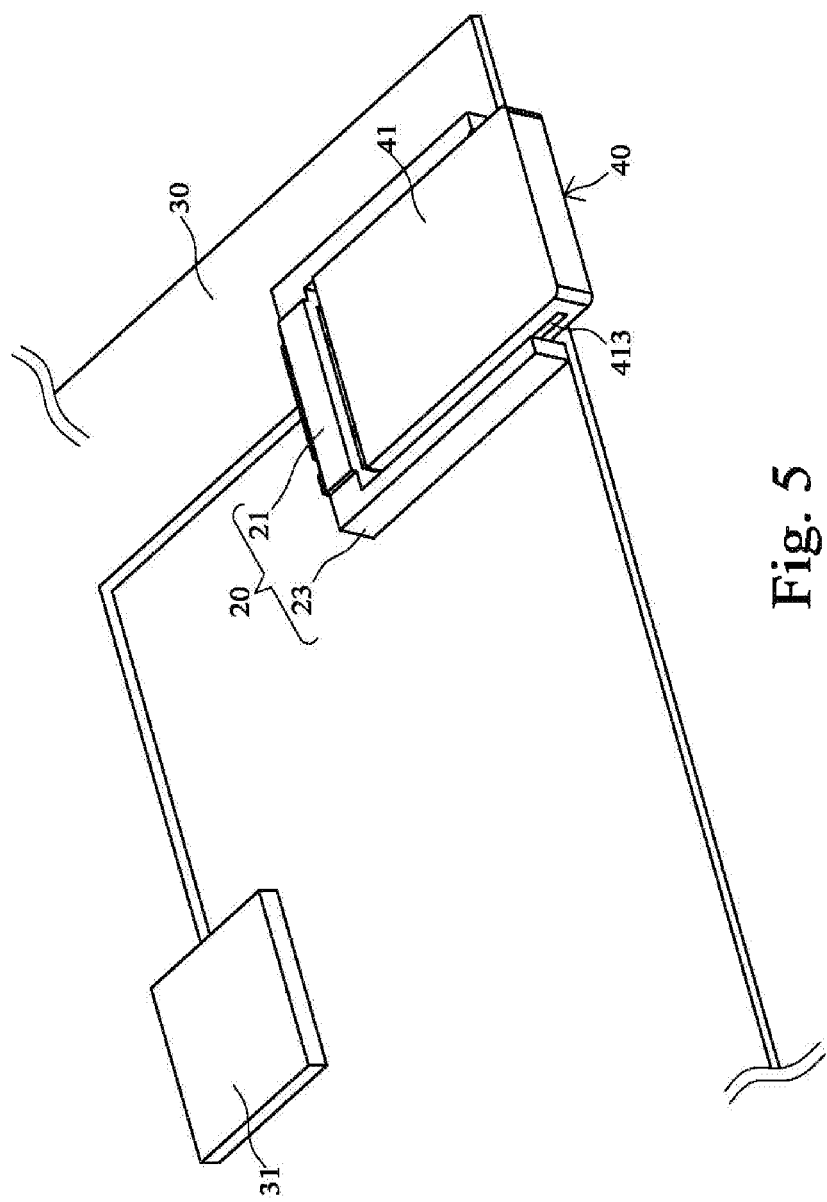
FIG. 5 is a three-dimensional view of the M.2 interface memory device inserted into the M.2 interface connection seat according to another embodiment of the present invention.

As shown in FIG. 4 and FIG. 5, in another embodiment of the present invention, the guide groove 231 on the arms 23 of the M.2 interface connection seat 20 may be replaced by a guide rail 233, and the guide rail 411 on the side surface of the housing 41 of the M.2 interface memory device 40 may be replaced by a guide groove 413. When the M.2 interface card 401 of the M.2 interface memory device 40 is inserted into the interface slot 201 of the M.2 interface connection seat 20 in a horizontal direction, the M.2 interface memory device 40 will be fixed within the card accommodating area 203 of the M.2 interface connection seat 20 by embedding between the guide rail 233 and the guide groove 413.

Figure 6:
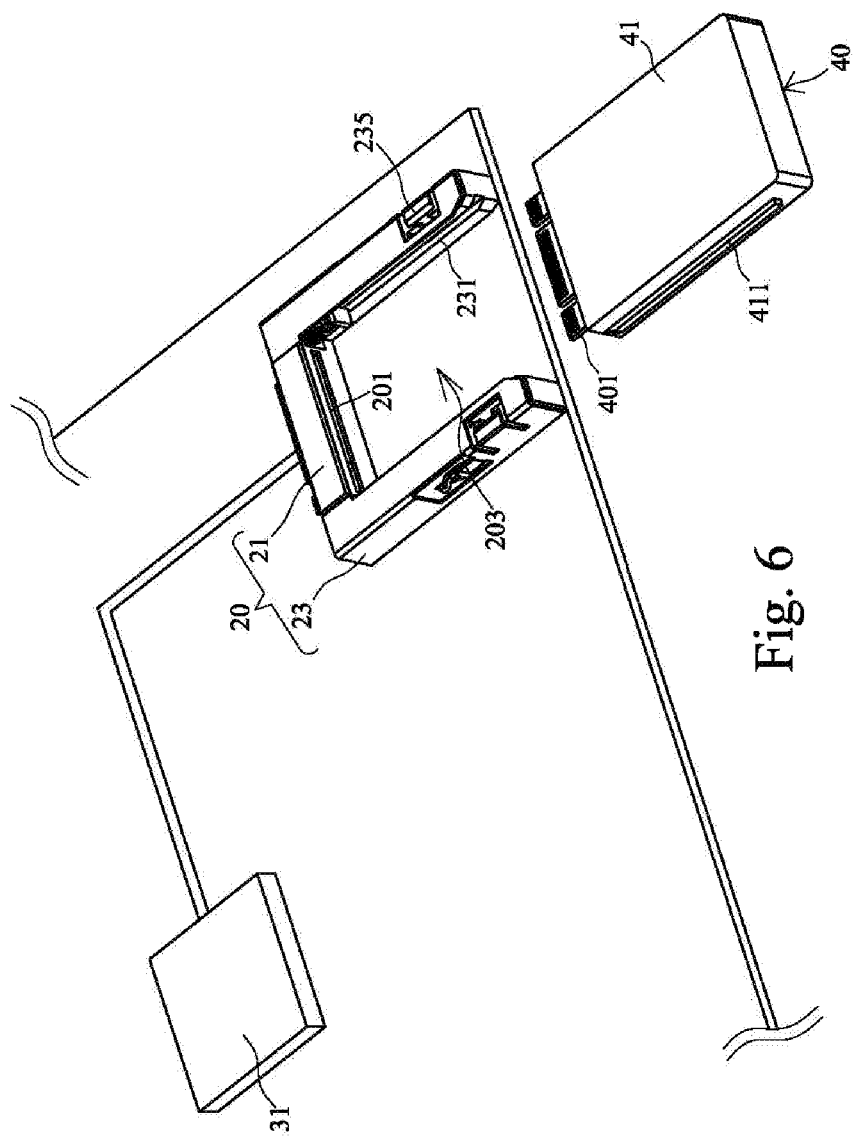
FIG. 6 is a three-dimensional view of the M.2 interface memory device separated from the M.2 interface connection seat according to another embodiment of the present invention.
Figure 7:
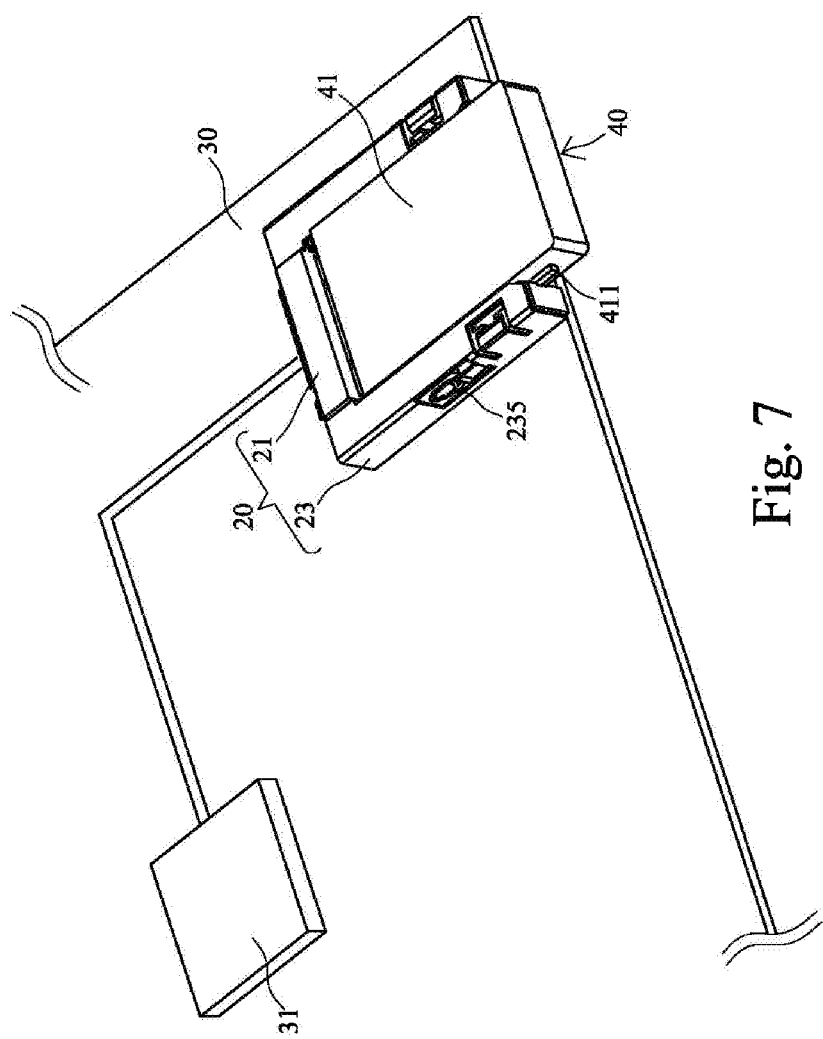
FIG. 7 is a three-dimensional view of the M.2 interface memory device inserted into the M.2 interface connection seat according to another embodiment of the present invention.

Referring to FIG. 6, there is shown a three-dimensional view of the M.2 interface memory device separated from the M.2 interface connection seat according to another embodiment of the present invention, and referring to FIG. 7, there is shown a three-dimensional view of the M.2 interface connector inserted into the M.2 interface connection seat according to another embodiment of the present invention.

In the present embodiment, one or two arms 23 of the M.2 interface connection seat 20 are provided with a card ejecting mechanism 235.

As shown in FIG. 6, when the M.2 interface memory device 40 is desired to push into the card accommodating area 203 of the M.2 interface connection seat 20, the user presses the bottom of the housing 41 of the M.2 interface memory device 40 to move forward so that the card ejecting mechanism 235 is able to approach the base 21 by the pushing of the top of the housing 41 of the M.2 interface memory device 40. Subsequently, as shown in FIG. 7, when the card ejecting mechanism 235 has pashed to the side of the base 21, the M.2 interface memory device 40 can be fixed within the card accommodating area 203 through the card ejecting mechanism 235, and the interface card 401 of the M.2 interface memory device 40 is inserted into the interface slot 201 of the M.2 interface connection seat 20.

Further, returning to FIG. 6, when the M.2 interface memory device 40 is desired to eject from the M.2 interface connection seat 20, the user again presses the bottom of the housing 41 of the M.2 interface memory device 40 to move forward so that the card ejecting mechanism 235 is able to withdraw from the side of the base 21 and guide the M.2 interface memory device 40 to move backward. At this present, the interface card 401 of the M.2 interface memory device 40 is separated from the interface slot 201 of the M.2 interface connection seat 20. Thus, the M.2 interface memory device 40 is able to eject and withdraw from the card accommodating area 203 of the M.2 interface connection seat 20. Accordingly, it is able to increase the convenience of ejecting and withdrawing the M.2 interface memory device 40 from the M.2 interface connection seat 20 by the disposition of the card ejecting mechanism 235.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

The invention claimed is:

1. A M.2 interface connection seat, disposed on a circuit board, comprising:
   a base comprising an interface slot conforming to M.2 interface standard specification, wherein the interface slot comprises an opening, a direction of the opening of the interface slot is horizontal to a surface of the circuit board; and
   two arms provided on two sides of the base, respectively, a card accommodating area formed between the two arms and the base, wherein a M.2 interface memory device enters the M.2 interface connection seat via the card accommodating area, and the M.2 interface memory device is inserted into the interface slot of the M.2 interface connection seat by an interface card conforming to M.2 interface standard specification, wherein at least one of the arms is provided with a guide rail for guiding the M.2 interface memory device into the card accommodating area of the M.2 interface connection seat, wherein the M.2 interface memory device is covered with a housing, the housing comprises a guide groove; when the M.2 interface memory device enters the card accommodating area of the M.2 interface connection seat, the guide groove will be embedded with the guide rail, so that the M.2 interface memory device is able to enter or exit the card accommodating area of the M.2 interface connection seat by the guide groove moving on the guide rail of the M.2 interface connection seat.

2. A M.2 interface memory device, comprising: an interface card, conforming to M.2 interface standard specification, provided with at least one memory element, wherein the interface card of the M.2 interface memory device can be inserted into an interface slot of a M.2 interface connection seat disposed on a circuit board; and a housing disposed on the outside of the interface card to cover a body of the interface card, wherein the interface card comprises a plurality of interface terminals protruding from the housing, and the housing is provided on at least one side surface thereof with a guide rail;

wherein the M.2 interface connection seat comprises two arms and a base, the two arms are provided on two sides of the base, respectively, a card accommodating area is formed between the two arms and the base, the base comprises a interface slot conforming to M.2 interface standard specification, and at least one of the arms is provided with a guide groove; when the M.2 interface memory device enters the card accommodating area of the M.2 interface connection seat, the guide rail will be embedded in the guide groove, so that the M.2 interface memory device is able to enter or exit the card accommodating area of the M.2 interface connection seat by the guide rail moving on the guide groove of the M.2 interface connection seat.

3. The M.2 interface memory device according to claim 2, wherein the interface card of the M.2 interface memory device is inserted into the interface slot of the M.2 interface connection seat in a direction that is horizontal to a surface of the circuit board.

4. A M.2 interface memory device, comprising: an interface card, conforming to M.2 interface standard specification, provided with at least one memory element, wherein the interface card of the M.2 interface memory device can be inserted into an interface slot of a M.2 interface connection seat disposed on a circuit board; and a housing disposed on the outside of the interface card to cover a body of the interface card, wherein the interface card comprises a plurality of interface terminals protruding from the housing, and the housing is provided on at least one side surface thereof with a guide groove;

wherein the M.2 interface connection seat comprises two arms and a base, the two arms are provided on two sides of the base, respectively, a card accommodating area is formed between the two arms and the base, the base comprises a interface slot conforming to M.2 interface standard specification, and at least one of the arms is provided with a guide rail; when the M.2 interface memory device enters the card accommodating area of the M.2 interface connection seat, the guide groove will be embedded with the guide rail, so that the M.2 interface memory device is able to enter or exit the card accommodating area of the M.2 interface connection seat by the guide groove moving on the guide rail of the M.2 interface connection seat.

5. The M.2 interface memory device according to claim 4, wherein the interface card of the M.2 interface memory device is inserted into the interface slot of the M.2 interface connection seat in a direction that is horizontal to a surface of the circuit board.

6. The M.2 interface connection seat according to claim 1, wherein at least one of the arms is provided with a card ejecting mechanism, the interface card of the M.2 interface memory device is able to be fixed within the card accommodating area of the M.2 interface connection seat through the card ejecting mechanism, or the interface card of the M.2 interface memory device is able to be ejected and withdrawn from the card accommodating area of the M.2 interface connection seat through the card ejecting mechanism.

7. The M.2 interface connection seat according to claim 1, wherein the M.2 interface connection seat is located at an edge position of board body of the circuit board, the opening of the interface slot of the M.2 interface connection seat is placed outwardly, and thus the M.2 interface memory device is able to enter or exit the card accommodating area of the M.2 interface connection seat from the edge position of board body of the circuit board.

\* \* \* \* \*